US011038514B2

(12) United States Patent
Hossain et al.

(10) Patent No.: US 11,038,514 B2
(45) Date of Patent: *Jun. 15, 2021

(54) VARIABLE RESOLUTION DIGITAL EQUALIZATION

(71) Applicant: Rambus Inc., Sunnyvale, CA (US)

(72) Inventors: Masum Hossain, Edmonton (CA); Kenneth C. Dyer, Pleasanton, CA (US); Nhat Nguyen, San Jose, CA (US); Shankar Tangirala, Fremont, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/885,805

(22) Filed: May 28, 2020

(65) Prior Publication Data

US 2020/0366304 A1 Nov. 19, 2020

Related U.S. Application Data

(63) Continuation of application No. 16/272,236, filed on Feb. 11, 2019, now Pat. No. 10,707,885, which is a (Continued)

(51) Int. Cl.
H03M 1/00 (2006.01)
H04L 25/03 (2006.01)
(Continued)

(52) U.S. Cl.
CPC ........... *H03M 1/002* (2013.01); *H03M 1/007* (2013.01); *H04L 25/03* (2013.01);
(Continued)

(58) Field of Classification Search
CPC ...... H03M 1/002; H03M 1/007; H03M 1/145; H03M 1/365; H03M 13/2778; H03M 1/00;
(Continued)

(56) References Cited

U.S. PATENT DOCUMENTS 4,366,469 A 12/1982 Michaels et al.
5,122,800 A 6/1992 Philipp
(Continued)

OTHER PUBLICATIONS

Kull, Lukas et al., "Implementation of Low-Power 6-8 b 30-90 GS/s Time-Interleaved ADCs With Optimized Input Bandwidth in 32 nm CMOS", IEEE Journal of Solid-State Circuits, vol. 51, No. 3, pp. 636-648, Mar. 2016. 13 Pages.
(Continued)

*Primary Examiner* — Linh V Nguyen
(74) *Attorney, Agent, or Firm* — The Neudeck Law Firm, LLC

(57) ABSTRACT

A receiver includes a variable resolution analog-to-digital converter (ADC) and variable resolution processing logic/circuitry. The processing logic may use feed-forward equalization (FFE) techniques to process the outputs from the ADC. When receiving data from a channel having low attenuation, distortion, and/or noise, the ADC and processing logic may be configured to sample and process the received signal using fewer bits, and therefore less logic, than when configured to receiving data from a channel having a higher attenuation, distortion, and/or noise. Thus, the number of (valid) bits output by the ADC, and subsequently processed (e.g., for FFE equalization) can be reduced when a receiver of this type is coupled to a low loss channel. These reductions can reduce power consumption when compared to operating the receiver using the full (i.e., maximum) number of bits the ADC and processing logic is capable of processing.

20 Claims, 13 Drawing Sheets

Related U.S. Application Data continuation of application No. 15/818,434, filed on Nov. 20, 2017, now Pat. No. 10,230,384.

(60) Provisional application No. 62/484,273, filed on Apr. 11, 2017, provisional application No. 62/432,476, filed on Dec. 9, 2016.

(51) Int. Cl.
*H03M 1/14* (2006.01)
*H03M 1/36* (2006.01)

(52) U.S. Cl.
CPC ....... H04L 25/03038 (2013.01); *H03M 1/145* (2013.01); *H03M 1/365* (2013.01)

(58) Field of Classification Search
CPC ........ H03M 1/12; H03M 1/124; H03M 1/442; H03M 1/661; H03M 1/68; H03M 1/0624; H03M 1/121; H03M 1/1245; H03M 1/144; H03M 1/164; H03M 1/186; H03M 3/424; H04L 25/03; H04L 25/03038
USPC ................. 341/139, 155, 118, 120, 122, 142
See application file for complete search history.

(56) References Cited

U.S. PATENT DOCUMENTS

| | | | |
|---|---|---|---|
| 5,568,143 A | 10/1996 | Hutchinson et al. | |
| 5,999,511 A * | 12/1999 | Jeon | G11B 20/10009 369/124.13 |
| 6,340,944 B1 | 1/2002 | Chang et al. | |
| 6,504,863 B1 | 1/2003 | Hellmark | |
| 6,816,104 B1 | 11/2004 | Lin | |
| 6,864,817 B1 | 3/2005 | Salvi et al. | |
| 7,492,295 B2 | 2/2009 | Puma et al. | |
| 7,944,383 B2 | 5/2011 | Doris | |
| 7,965,215 B2 * | 6/2011 | Rofougaran | H03M 1/186 341/155 |
| 8,284,084 B1 | 10/2012 | Thiagarajan et al. | |
| 8,369,458 B2 | 2/2013 | Wong et al. | |
| 8,588,359 B2 | 11/2013 | Kibune | |
| 8,970,419 B2 | 3/2015 | Farley et al. | |
| 10,009,035 B1 | 6/2018 | LaCroix et al. | |
| 10,230,384 B2 | 3/2019 | Hossain et al. | |
| 10,707,885 B2 * | 7/2020 | Hossain | H03M 1/007 |
| 2002/0172112 A1 * | 11/2002 | Shoji | G11B 20/10314 369/47.35 |
| 2003/0078007 A1 * | 4/2003 | Parssinen | H04B 1/16 455/67.11 |
| 2004/0041722 A1 | 3/2004 | Wada et al. | |
| 2004/0125008 A1 | 7/2004 | Yamaji | |
| 2005/0259760 A1 | 11/2005 | Casabona et al. | |
| 2006/0120491 A1 * | 6/2006 | Yen | H04L 25/063 375/345 |
| 2009/0060102 A1 | 3/2009 | Wong et al. | |
| 2009/0154612 A1 | 6/2009 | Rofougaran | |
| 2009/0161798 A1 | 6/2009 | Wong et al. | |
| 2009/0174588 A1 * | 7/2009 | Muenter | H03M 1/007 341/155 |
| 2010/0226421 A1 * | 9/2010 | Kibune | H03M 1/007 375/229 |
| 2013/0069810 A1 | 3/2013 | Rofougaran | |
| 2013/0076546 A1 | 3/2013 | Wan et al. | |
| 2014/0328353 A1 | 11/2014 | Li et al. | |
| 2014/0337676 A1 | 11/2014 | Yen et al. | |
| 2016/0006478 A1 | 1/2016 | Bruchner | |
| 2016/0217872 A1 * | 7/2016 | Hossain | G11C 27/02 |

OTHER PUBLICATIONS

Nakane, Hideo, et al., "A Fully Integrated SAR ADC Using Digital Correction Technique for Triple-Mode Mobile Transceiver", IEEE Journal of Solid-State Circuits, vol. 49, No. 11, pp. 2503-2514, Nov. 2014. 12 Pages.

* cited by examiner

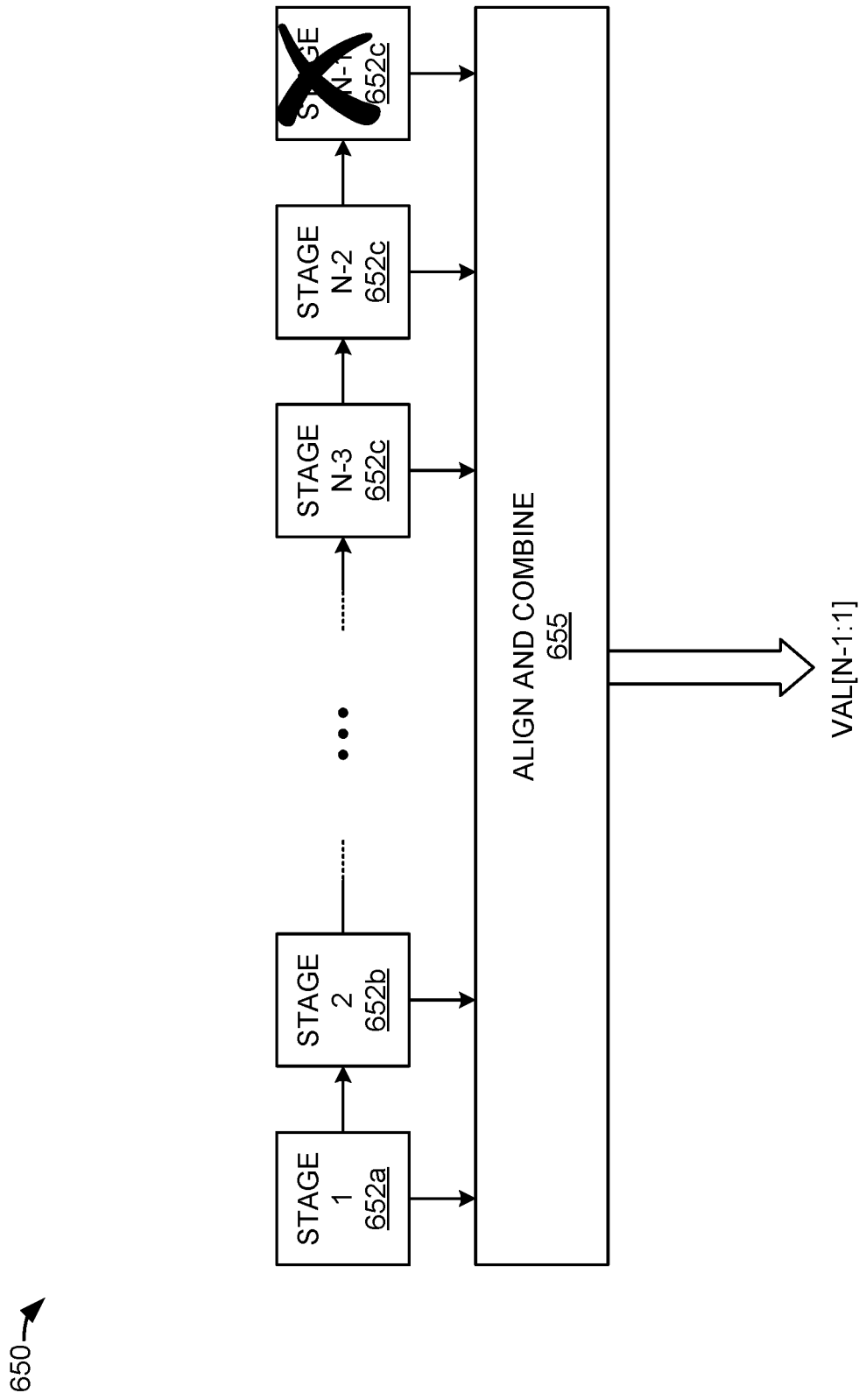

VARIABLE RESOLUTION DIGITAL EQUALIZATION

BRIEF DESCRIPTION OF THE DRAWINGS

FIGS. 6A-6B are diagrams illustrating variable resolution operation of a pipeline analog-to-digital converter.

DETAILED DESCRIPTION OF THE EMBODIMENTS

Various embodiments described herein relate to a system including integrated circuit devices, for example, memory devices and/or at least a memory controller device that controls such memory devices (and methods of operation of these respective devices). Integrated circuit devices may communicate information (e.g., commands and addresses, and/or data) by driving/transmitting signals on interconnects between devices. The circuits used to send these signals may be referred to as drivers, transmitter, and/or output circuits. The circuits to receive these signals may be referred to as receivers, samplers, and/or input circuits.

Multilevel modulation schemes may be used for the communication between integrated circuits. An analog-to-digital converter (ADC) may be used as part of a receiver for this communication. Some ADC based receivers can compensate for relatively high channel loss when coupled with digital equalization.

In an embodiment, a receiver includes a variable resolution ADC and variable resolution processing logic/circuitry. The processing logic may use feed-forward equalization (FFE) techniques to process the outputs from the ADC. When receiving data from a channel having low attenuation, distortion, and/or noise, the ADC and processing logic may be configured to sample and process the received signal using fewer bits, and therefore less logic, than when configured to receiving data from a channel having a higher attenuation, distortion, and/or noise. Thus, the number of (valid) bits output by the ADC, and subsequently processed (e.g., for FFE) can be reduced when a receiver of this type is coupled to a low loss channel. These reductions can reduce power consumption when compared to operating the receiver using the full (i.e., maximum) number of bits the ADC and processing logic is capable of processing.

Figure 1:
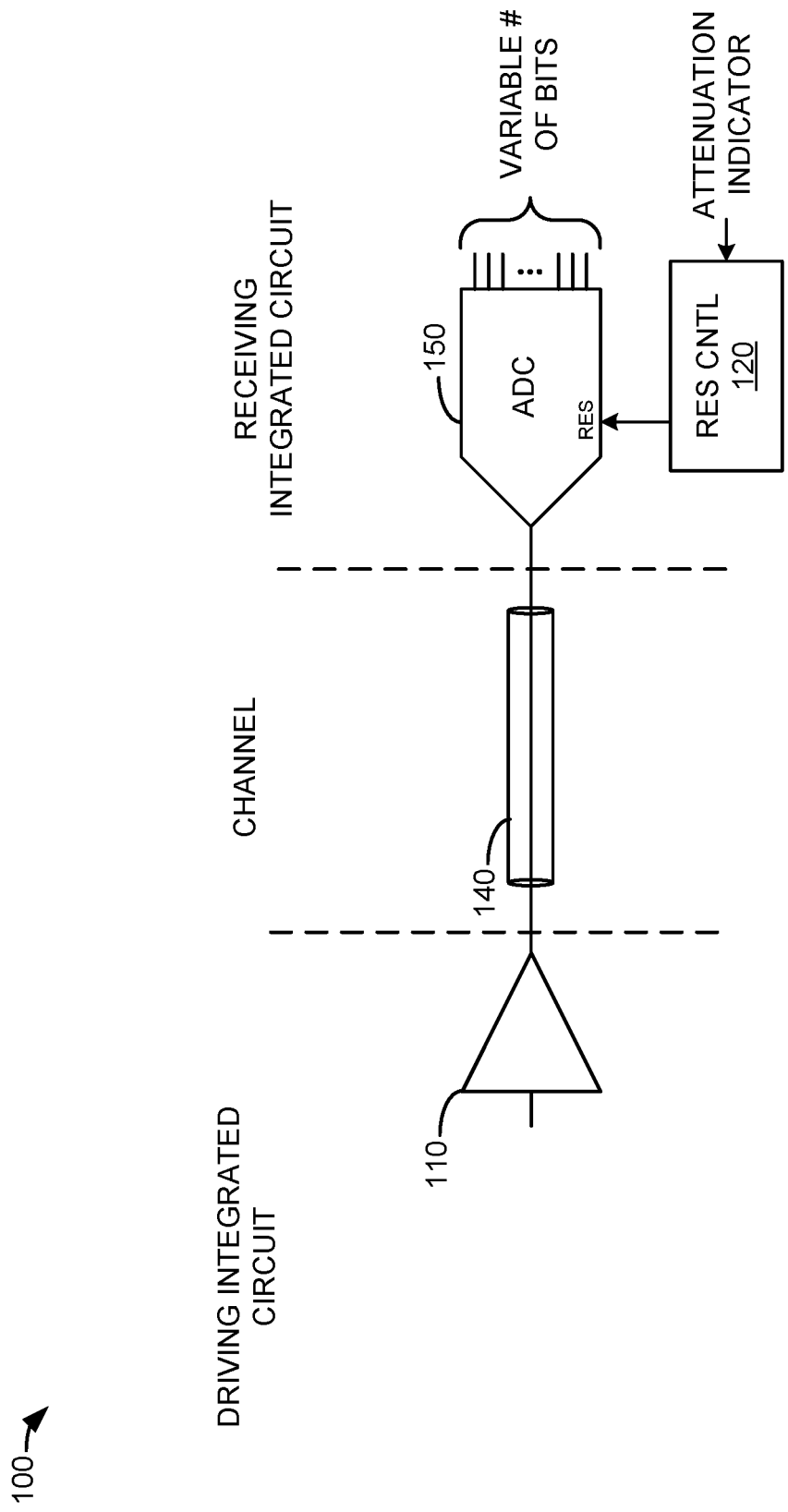
FIG. 1 is a block diagram illustrating a digital data communication system.

FIG. 1 is a block diagram illustrating a digital data communication system. In FIG. 1, communication system 100 comprises a driving integrated circuit, a receiving integrated circuit, and a channel connecting them. The driving integrated circuit includes transmitter circuit 110 (a.k.a., a driver). The receiver integrated circuit includes ADC circuit 150 and resolution control circuit 120. The channel between the driving integrated circuit and the receiving integrated circuit comprises interconnect system 140. Interconnect system 140 would typically comprise a printed circuit (PC) board, connector, cable, flex circuit, other substrate, and/or a combination of these. Interconnect system 140 may be and/or include one or more transmission lines. It should also be understood that although system 100 and other described herein are illustrated as receiving a single-ended signal, the signals sent by the driving integrated circuit of system 100 via interconnect system 140 and received by receiving integrated circuit (e.g., sampled by ADC 150) may be and/or represent a pair of differential signals.

The output of driver 110 is connected to a first end of interconnect system 140. The second end of interconnect system 140 is connected to the input of ADC 150. Resolution control 120 is operatively coupled to ADC 150. Resolution control 120 is operatively coupled to ADC 150 in order to control the number of bits (and therefore the power consumed) output by ADC 150 when it converts the analog voltage at ADC 150's input to a digital value. In an embodiment, resolution control 120 controls the number of bits output by ADC 150 (and therefore the power consumed) based on the channel loss (a.k.a., attenuation) of interconnect system 140. Resolution control 120 receives an indicator (e.g., low, medium, high, dB of loss, number of bits to convert/output, etc.) of the channel loss (a.k.a., attenuation) of interconnect system 140.

Figure 2A:
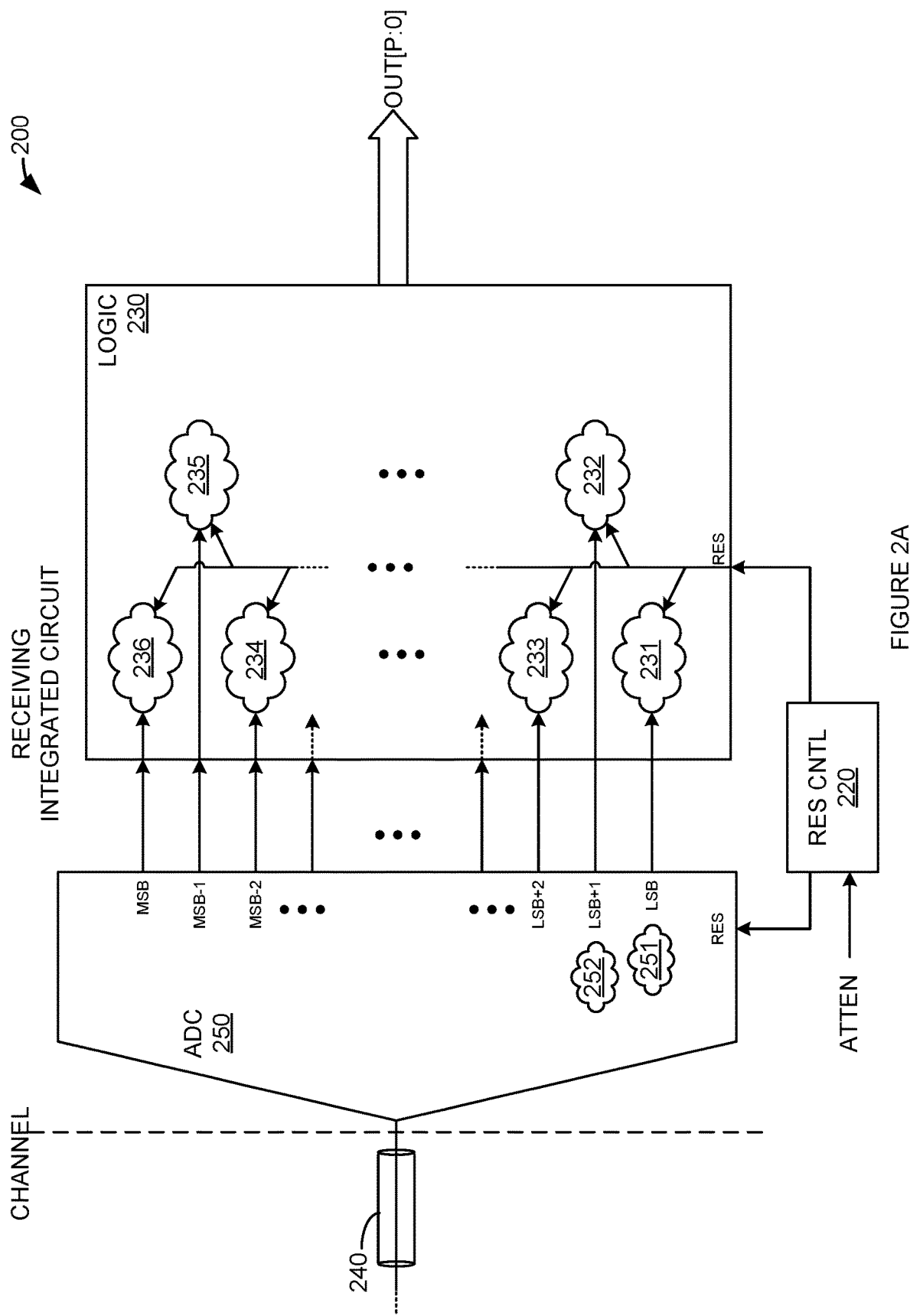
FIGS. 2A-2C are diagrams illustrating variable resolution data reception.
Figure 2B:
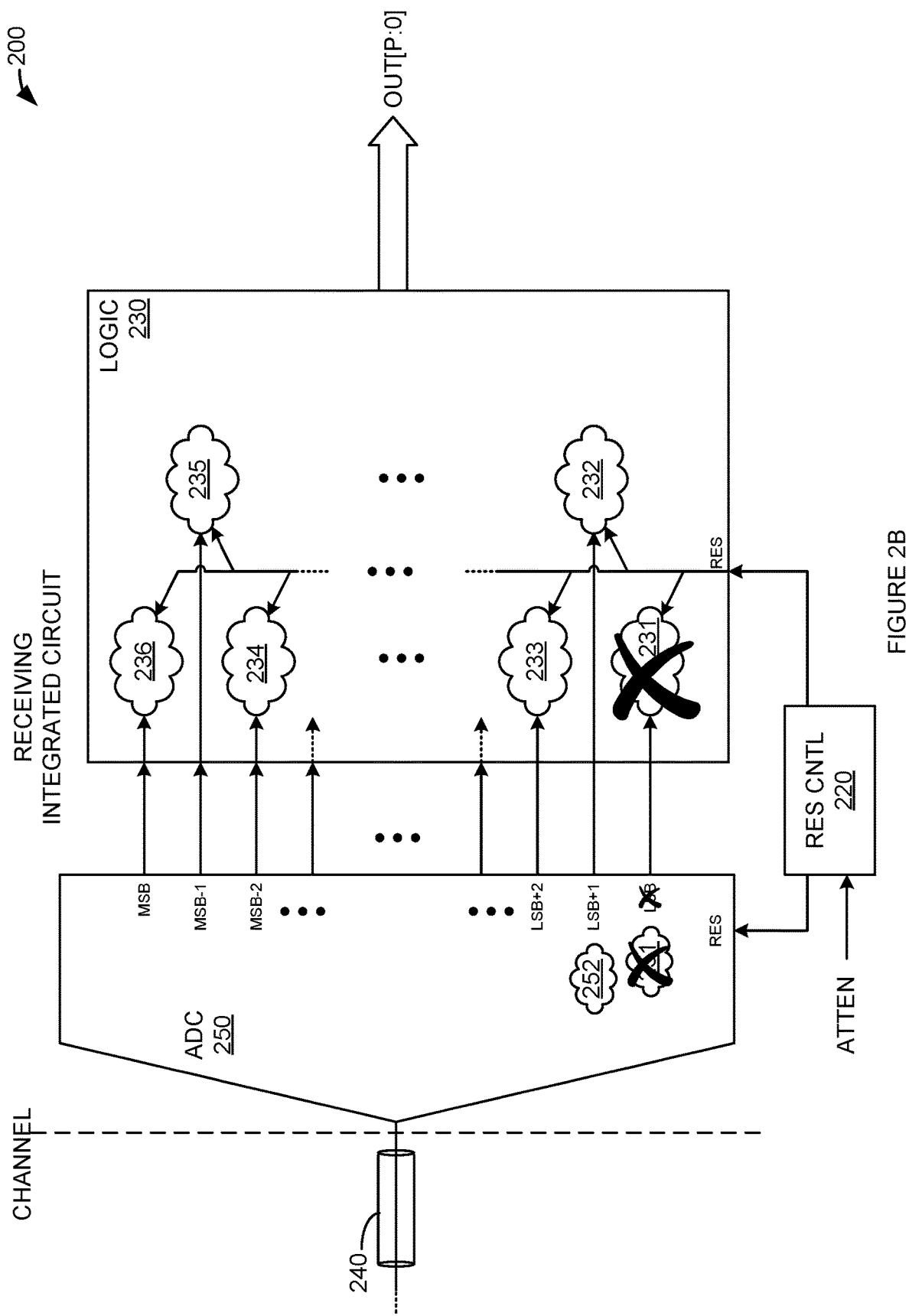
Figure 2C:
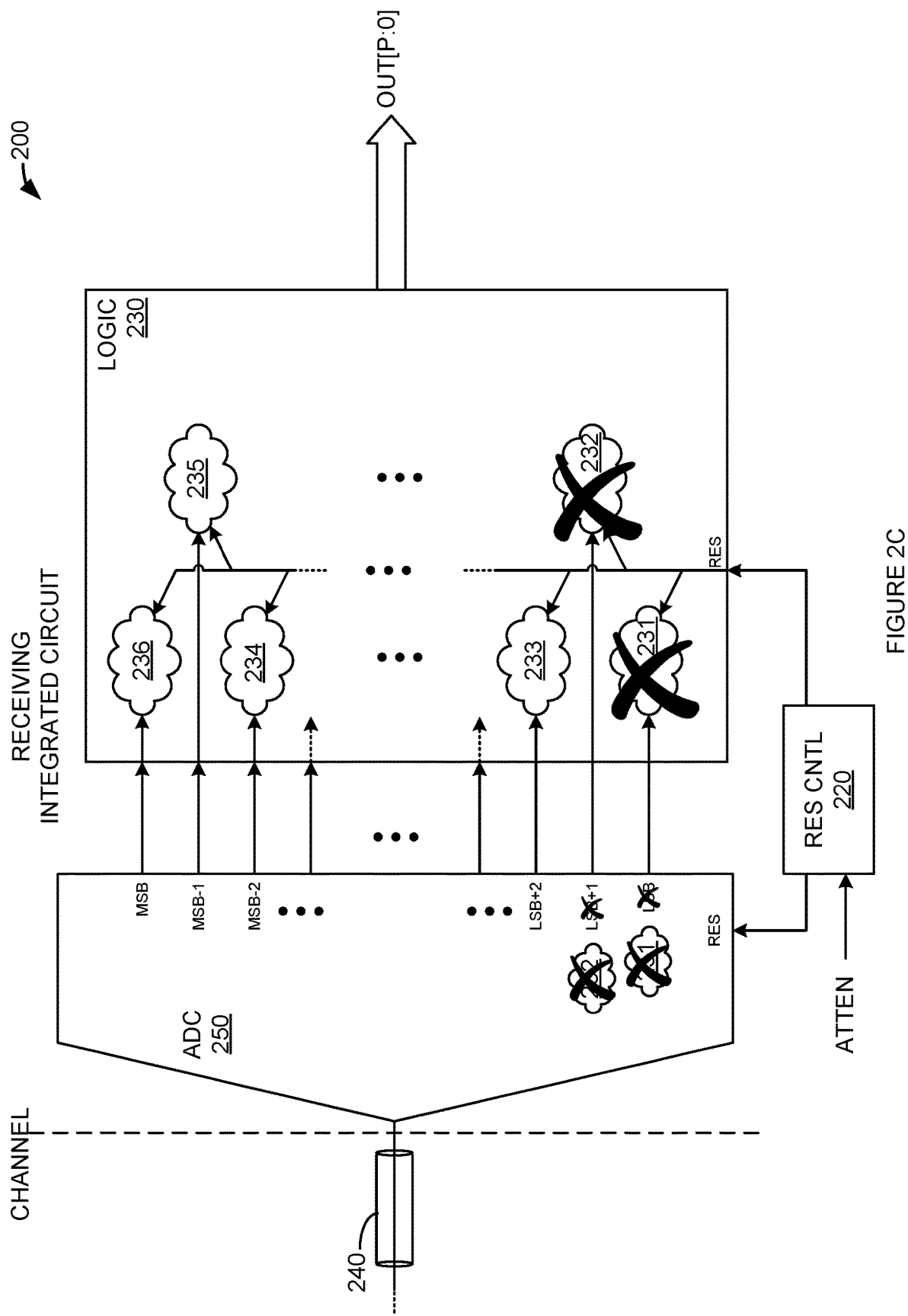

FIGS. 2A-2C are diagrams illustrating variable resolution data reception. In FIGS. 2A-2C, receiving system 200 comprises variable resolution ADC 250, logic 230, and resolution control 220. The analog input to ADC 250 is coupled to interconnect network 240. The variable bit-width output of ADC 250 is operatively coupled to logic 230. Each bit from the least-significant bit (LSB) to the most-significant bit (MSB) output by ADC 250 are provided to logic 230.

In an embodiment, one or more bits generated by ADC 250 may be associated with ADC sampling and/or calibration circuitry 252-253 that can be inactivated, or not used, when the corresponding bit is not output by ADC 250 (or is invalid.) In FIG. 2, the LSB bit output by ADC 250 is associated with circuitry 251. The next more significant bit (LSB+1) is associated with circuitry 252. The bits, and the corresponding logic that is inactivated or not used (e.g., to save power consumption, etc.), are controlled by resolution control 220 in response to an indicator of the channel attenuation of interconnect network 240. Thus, with lower resolution settings, support and/or calibration circuitry 251-252 not required when a reduced number of valid bit are output may be powered down. Powering-down may include reducing bias currents (quiescent) in lower resolution modes. In an embodiment, receiving system 200 only fully powers-up a minimum amount of hardware elements needed to maintain the link performance, and/or reduces the power of unused elements that cannot be powered down completely.

In FIG. 2, each bit provided by ADC 250 to logic 230 is associated with respective logic sub-blocks 231-236 that can be inactivated, or not used, when the corresponding bit is not output by ADC 250 (or is invalid.) The bits, and the corresponding logic that is inactivated or not used (e.g., to save power consumption, etc.), are controlled by resolution control 220 in response to an indicator of the channel attenuation of interconnect network 240. Logic sub-block 231 is associated with processing the LSB output by ADC 250. Logic sub-block 232 is associated with processing the next more significant bit (i.e., LSB+1) output by ADC 250. Logic sub-block 233 is associated with processing bit LSB+2 output by ADC 250. This pattern continues for all of the bits output by ADC 250. This is further illustrated in FIG. 2 where logic sub-block 234 is associated with processing MSB−2; logic sub-block 235 is associated with processing MSB−1; and, logic sub-block 236 is associated with processing the most significant bit—MSB.

Logic 230 may be, for example, circuitry to process the digital numbers output by ADC 250. In particular, logic 230 may perform feed-forward equalization based on the outputs of ADC 250. In FIG. 2A, ADC 250 and logic 230 are illustrated as providing and using all of the bits available from ADC 250. The output of logic 230 is one or more bits OUT[P:0], where P is an integer greater than or equal to zero. For example, when a 2-level pulse-amplitude modulation (PAM-2) signal is being received by receiver system 200, logic 230 may be configured to output a single bit—OUT[0]. In another example, when a 4-level pulse-amplitude modulation (PAM-4) signal is being received by receiver system 200, logic 230 may be configured to output two bits—OUT[1:0], and so on.

As discussed herein, portions (and/or sub-blocks 231-236) of logic 230 may be inactivated by resolution control 220 based on an indicator (ATTEN) associated with the attenuation of interconnect network 240. This is further illustrated by example in FIGS. 2B and 2C.

In FIG. 2B, resolution control 220 has configured ADC 250 and logic 230 to use a resolution that does not include (and/or ignores) the least-significant bit (LSB) output by ADC 250. This is illustrated by the "X" over the LSB output of ADC 250, a corresponding "X" over support and/or calibration circuitry 251, and a corresponding "X" over sub-block 231. Note that even at the reduced resolution illustrated in FIG. 2B, the output of logic 230 can still be the same one or more bits OUT[P:0], where P is an integer greater than or equal to zero.

In FIG. 2C, resolution control 220 has configured ADC 250 and logic 230 to use a resolution that does not include (and/or ignores) the two least-significant bits output by ADC 250. This is illustrated by the X's over the LSB and LSB+1 outputs of ADC 250, the corresponding X's over support and/or calibration circuitry 251 and 252, and the corresponding X's over sub-block 231 and sub-block 232.

It should be understood that, in an embodiment, the digital equalization (e.g., FFE) is two-step process: In the first step, a front-end converts a received analog signal from the interconnect network 240 to a digital form using an ADC (e.g., ADC 150 or 250). In the second step, logic 230 (e.g., a digital signal processor (DSP), finite state machine, combinational logic, and/or a lookup table, etc.) equalizes the digitized outputs from the ADC.

Resolution (i.e., the number of valid/used bits in each digital sample) in both the data conversion step/logic and the processing step/logic are parameters that affect the power consumed by the receiver system 200. In an embodiment, a factor that determines the resolution used by receiver system 200 is the channel loss of interconnect network 240.

For example, a higher FFE gain from logic 230 may be needed to compensate long interconnect network channels that suffer from higher loss at baud-rate (e.g., 14 GHz for 56 Gb/s PAM-4 signaling). FFE amplifies both high frequency signal content and noise. In a receiver system 200 that uses an ADC 250, quantization noise affects receiver system 200's ability to correctly resolve the signaling levels.

For example, in a case where interconnect network channel 240 causes a 30 dB loss to the transmitted signal, a higher resolution (e.g., more than 5 bit) ADC may be required. However, at a lower channel attenuation, less FFE gain is required. This allows a lower resolution (e.g., less than 5 bit) ADC and logic 230 processing to have acceptable performance.

This variable resolution sampling and processing can translate to significant power savings in both the ADC 250 and also in logic 230. For example, if ADC 250 is a flash type ADC (see, e.g., FIGS. 5A-5B), N bit resolution requires $2N-1$ number of comparators are. In an embodiment, a flash type ADC 250 can be implemented to produce, when controlled by resolution control 220, the highest resolution number of bits. However, when controlled by resolution control 220 to operate at a lower resolution some of the $2N-1$ comparators can be disabled to reduce power.

In another example, if ADC 250 is a successive approximation type ADC (see FIG. 3), a bit decision is made starting from the MSB to towards LSB for each successive approximation register (SAR) cycle. As illustrated in FIG. 4, for an N-bit digital output, ADC 250 will iterate for N SAR cycles. Thus, when resolution control 220 configures receiver system 200 for lower resolution than the maximum, N, the number of SAR cycles can be reduced to N−K. For a self-timed SAR ADC 250, power is only consumed when the internal SAR comparator makes decisions. This further saves clock-tree power. Similarly, if ADC 250 is a multi-stage pipelined-ADC (see, e.g., FIG. 6A-6B), the later stages can be shut down. This reduces the power consumed. Thus, it should be understood that in an embodiment, ADC 250 can be configured for lower resolution thereby yielding a power savings for many types of ADCs.

In an embodiment, an interface (e.g., input to ADC 250) is coupled to receive a signal that is conveyed via interconnect network channel 240. Interconnect network channel 240 attenuates the signal by an attenuation amount as the signal is conveyed by channel 240. An adjustable resolution analog-to-digital converter (ADC) 250 receives the signal via the interface. Resolution control circuitry 220 determines a resolution of ADC 250 based on the attenuation amount.

In an example, ADC 250 may correspond to a successive approximation type ADC. In this example therefore, resolution control circuitry 220 thereby determines the resolution of ADC 250 by controlling the number of successive approximation iterations ADC 250 uses to convert the received signal to a digital number.

In other examples, ADC 250 may correspond to a flash or pipeline type ADC. In these examples therefore, resolution control circuitry 220 determines the resolution of ADC 250 by controlling the number of quantization paths ADC 250 uses to convert the received signal to a digital number.

In an embodiment, logic 230 receives, from ADC 250, one or more digital numbers corresponding to the received signal. Logic 230 may be or comprise feed-forward equalization circuitry. Logic 230 may produce, based on a processing of the one or more digital numbers, an equalized output based on a finite impulse response filtering of digital numbers received from ADC 250. Resolution control circuitry 220 may also determine the resolution logic 230 uses to process the digital numbers to produce the equalized output.

In an embodiment, an integrated circuit receives a signal from interconnect network channel 240. Interconnect channel 240 attenuates a transmitted signal by an attenuation factor. Adjustable resolution analog-to-digital converter (ADC) 250 converts the signal from an analog parameter (e.g., voltage, current) to a variable resolution digital value (e.g., VAL[N−1:0]) Resolution control circuitry 220 determines the number of valid bits that are in the variable resolution digital value based on the attenuation factor.

In an example, the number of valid bits in the variable resolution digital value may be controlled by setting a number of successive approximation iterations performed by the adjustable resolution ADC 250. In another example, the number of valid bits in the variable resolution digital value may be controlled by setting a number of active quantization paths used by the adjustable resolution ADC 250. The number of valid bits in the variable resolution digital value may be controlled by activating and/or deactivating circuitry to be used by the adjustable resolution ADC 250 (e.g., comparators, stages, etc.).

In an embodiment, ADC 250 produces a time series comprising two or more variable resolution values. Logic 230 circuitry digitally processes the time series using circuitry that is activated based on the number of valid bits in the variable resolution digital value. This digital processing of the time series may comprise feed-forward equalization processing. In an embodiment, adjustable resolution ADC 250 comprises a plurality of interleaved ADC converters.

In an embodiment, logic 230 at least feed-forward equalizes the time series of samples. Logic 230 may use a variable number of FFE taps where the number of FFE taps that are activated (or deactivated) is based on the variable resolution digital value. Likewise, for example, portions and/or sub-blocks 231-236 of logic 230 that are associated with unused or deactivated FFE taps may also be disabled.

Figure 3:
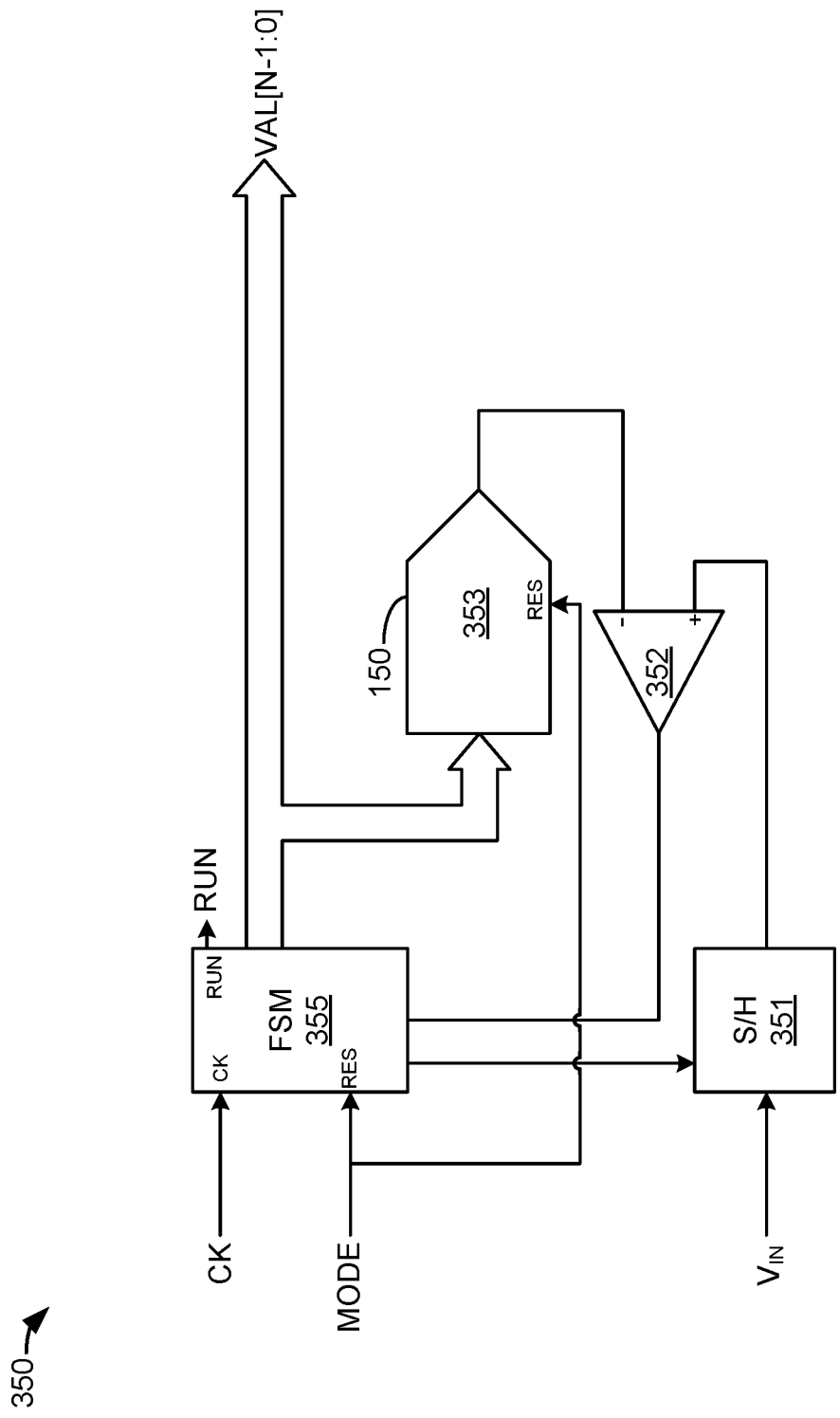
FIG. 3 is a block diagram illustrating a successive approximation analog-to-digital converter (ADC).
Figure 4:
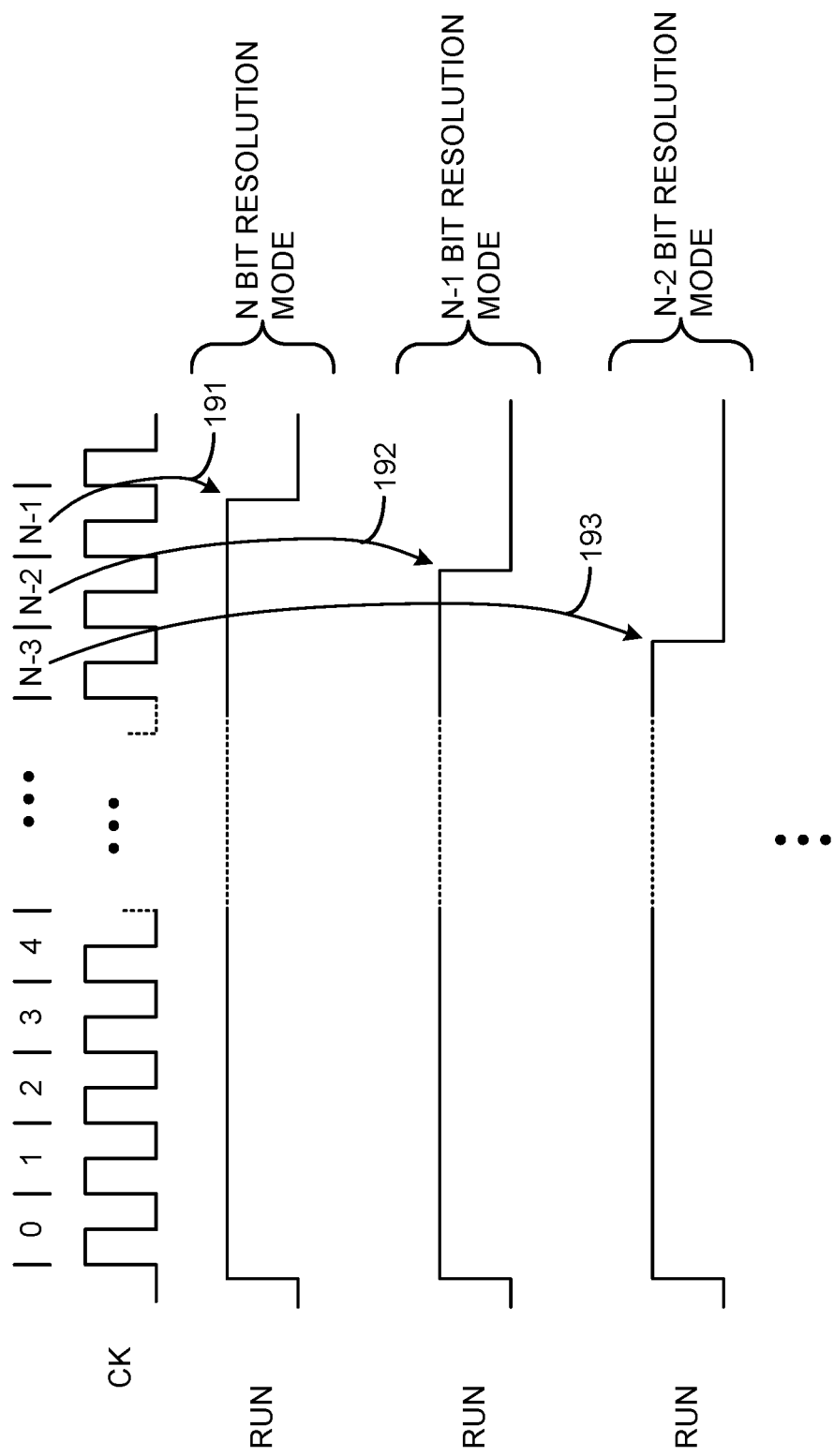
FIG. 4 is a timing diagram illustrating variable resolution operation of a successive approximation analog-to-digital converter.

FIG. 3 is a block diagram illustrating a successive approximation analog-to-digital converter (ADC). In FIG. 3, SAR ADC 350 includes a sample-and-hold (S/H) 351, comparator 352, digital-to-analog converter (DAC) 353, and finite state machine 355. ADC 350 receives an analog input, $V_{IN}$, a mode indicator, MODE, and a timing reference signal CK. FSM may also produce a signal, RUN, that indicates ADC 350 is iterating.

FSM is operatively coupled to control sample-and-hold (S/H) 351, comparator 352, digital-to-analog converter (DAC) 353. FSM receives the timing reference signal, CK and the mode indicator, MODE. Mode indicator MODE determines the resolution (i.e., number of bits) that ADC 350's outputs. FSM controls the operation of S/H 351, DAC 353, and/or comparator 352. FSM controls S/H 351 and DAC 353 in response to the output of comparator 352 to perform a binary search until every bit of the resolution configured by the MODE input is determined. While this binary search is being performed, FSM may output and indicator, RUN, that is associated with ADC 350 performing iterations to determine its output VAL[N−1:0]. The resulting output VAL[N−1:0] indicates a digital approximation of $V_{IN}$. In an embodiment, VAL[N−1:0] may be output (or be indicated to be valid) by FSM 355 at the end of the conversion (e.g., when RUN is deasserted).

FIG. 4 is a timing diagram illustrating variable resolution operation of a successive approximation analog-to-digital converter. In FIG. 4, three resolution modes are illustrated. In an N bit resolution mode, the signal RUN is asserted from cycle 0 through cycle N−1—thus illustrating that ADC 350 iterates and consumes power for N number of iteration cycles. This is illustrated by arrow 191. In an N−1 (i.e., lower) resolution mode, the signal RUN is asserted from cycle 0 through cycle N−2—thus illustrating that ADC 350 iterates and consumes power for N−1 number of iteration cycles. This is illustrated by arrow 192. In an N−2 resolution mode, the signal RUN is asserted from cycle 0 through cycle N−3—thus illustrating that ADC 350 iterates and consumes power for N−2 number of iteration cycles when in the N−2 mode. It should be understood that when ADC 350 iterates fewer cycles, less power is consumed by ADC 350.

Figure 5A:
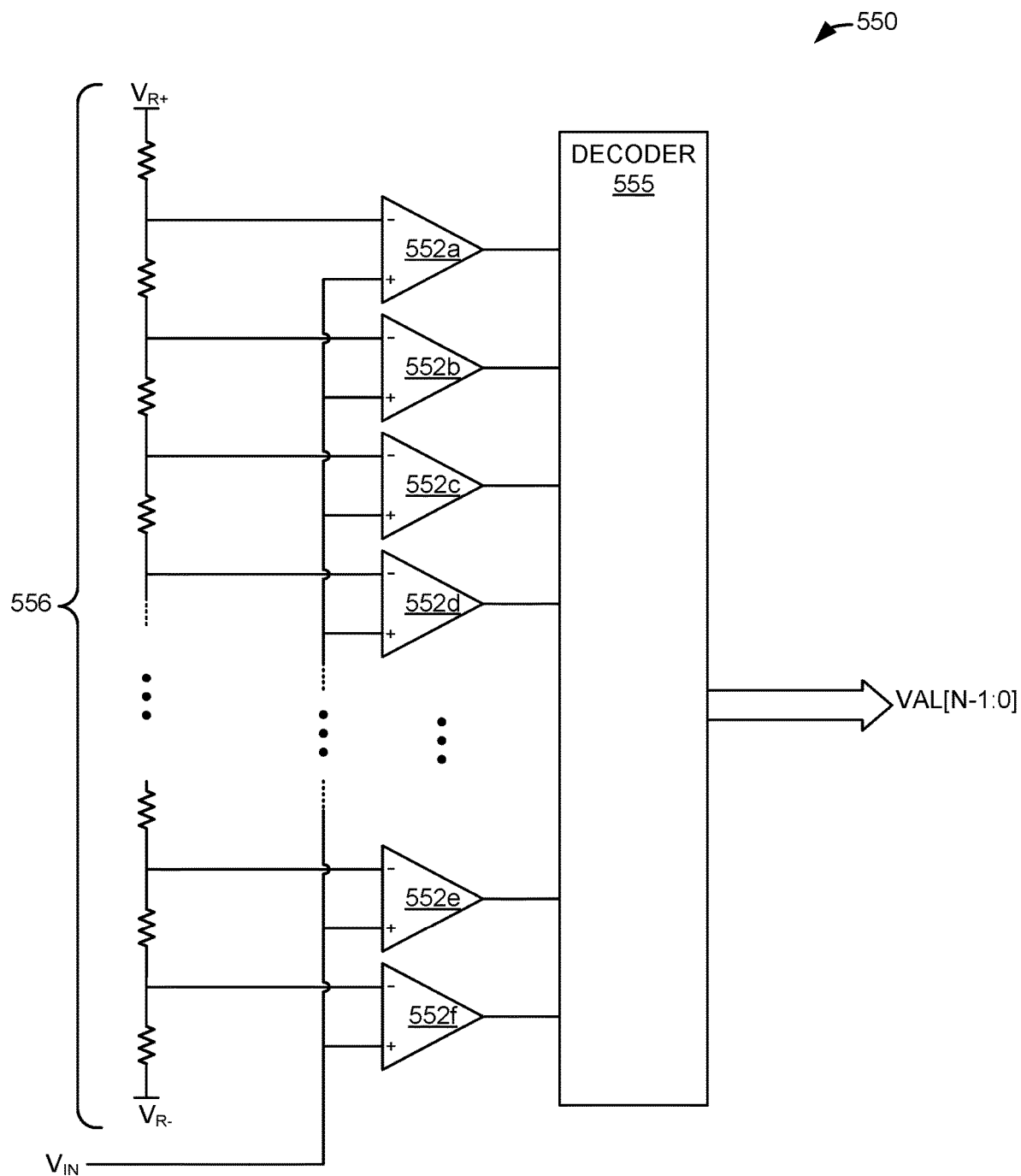
FIGS. 5A-5B are diagrams illustrating variable resolution operation of a flash analog-to-digital converter.
Figure 5B:
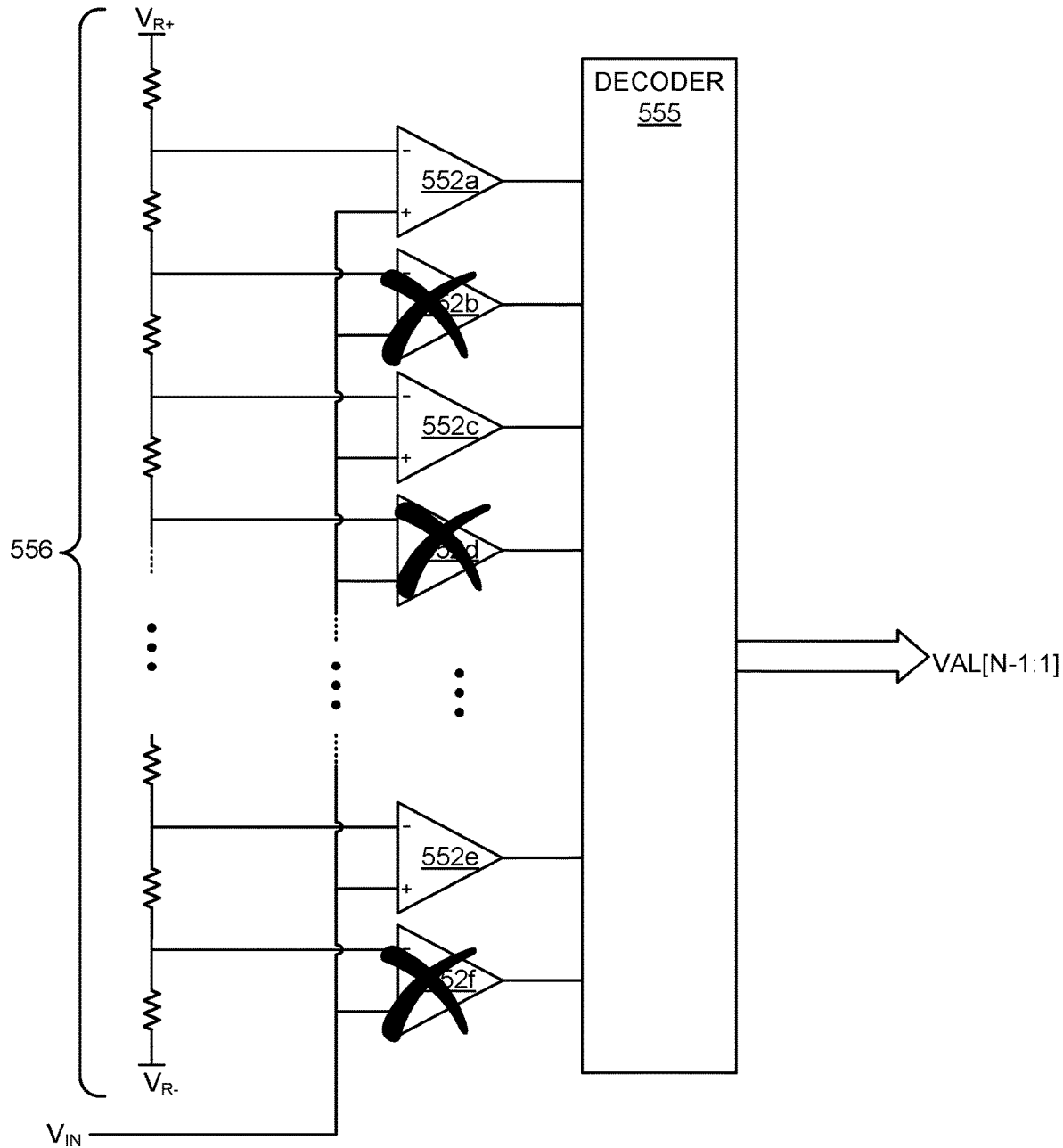

FIGS. 5A-5B are diagrams illustrating variable resolution operation of a flash analog-to-digital converter. In FIGS. 5A-5B, flash ADC 550 includes voltage divider 556, comparators 552a-552f, and decoder 555. Voltage divider 556 provides reference voltages to comparators 552a-552f. Comparators 552a-552f compare these reference voltages to the analog input, $V_{IN}$. The outputs of comparators 552a-552f are provided to a decoder (e.g., thermometer code decoder) in order to determine ADC 350's output VAL[N−1:0].

In an embodiment, some of comparators 552a-552f are disabled to reduce power consumption. This is illustrated in FIG. 5B. In FIG. 5B, ADC 550 has been configured to produce a resolution that does not include (and/or ignores) the least-significant bit output by ADC 550. This is illustrated by the X's over comparators 552b, 552d, and 552f and the output bits VAL[N−1:1] (contrast this with the VAL[N−1:0] output shown in FIG. 5A.)

Figure 6A:
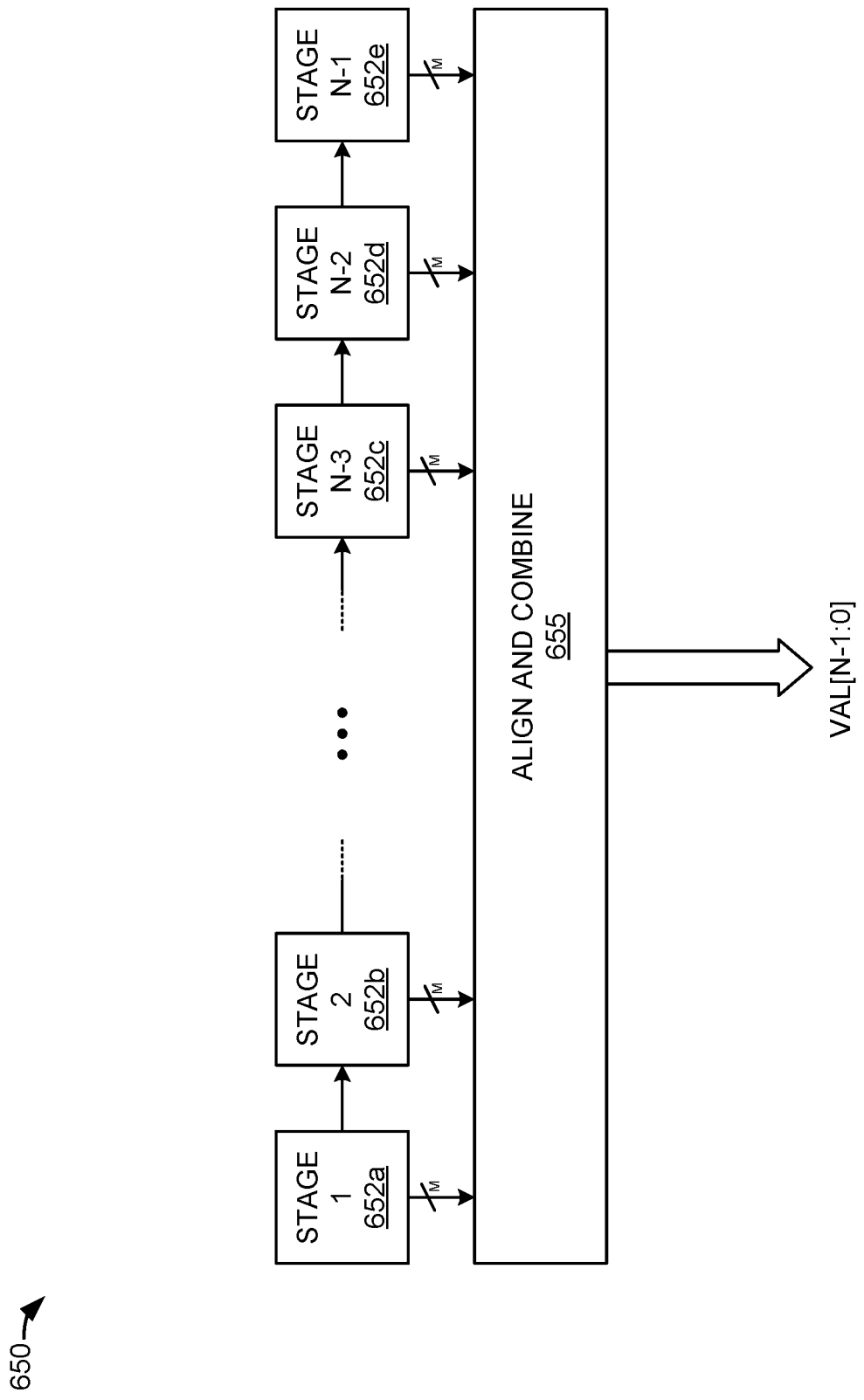

FIGS. 6A-6B are diagrams illustrating variable resolution operation of a pipeline analog-to-digital converter. In FIGS. 6A-6B, pipeline ADC 650 includes stages 652a-652f. The outputs of stages 652a-652f are provided to align and combine block 655 in order to determine ADC 650's output VAL[N−1:0].

In an embodiment, some of stages 652a-652f are disabled to reduce power consumption. This is illustrated in FIG. 6B. In FIG. 6B, ADC 650 has been configured to produce a resolution that does not include (and/or ignores) the least-significant bit output by ADC 650. This is illustrated by the X over stage 652f and the output bits VAL[N−1:1] (contrast this with the VAL[N−1:0] output shown in FIG. 6A.)

Figure 7:
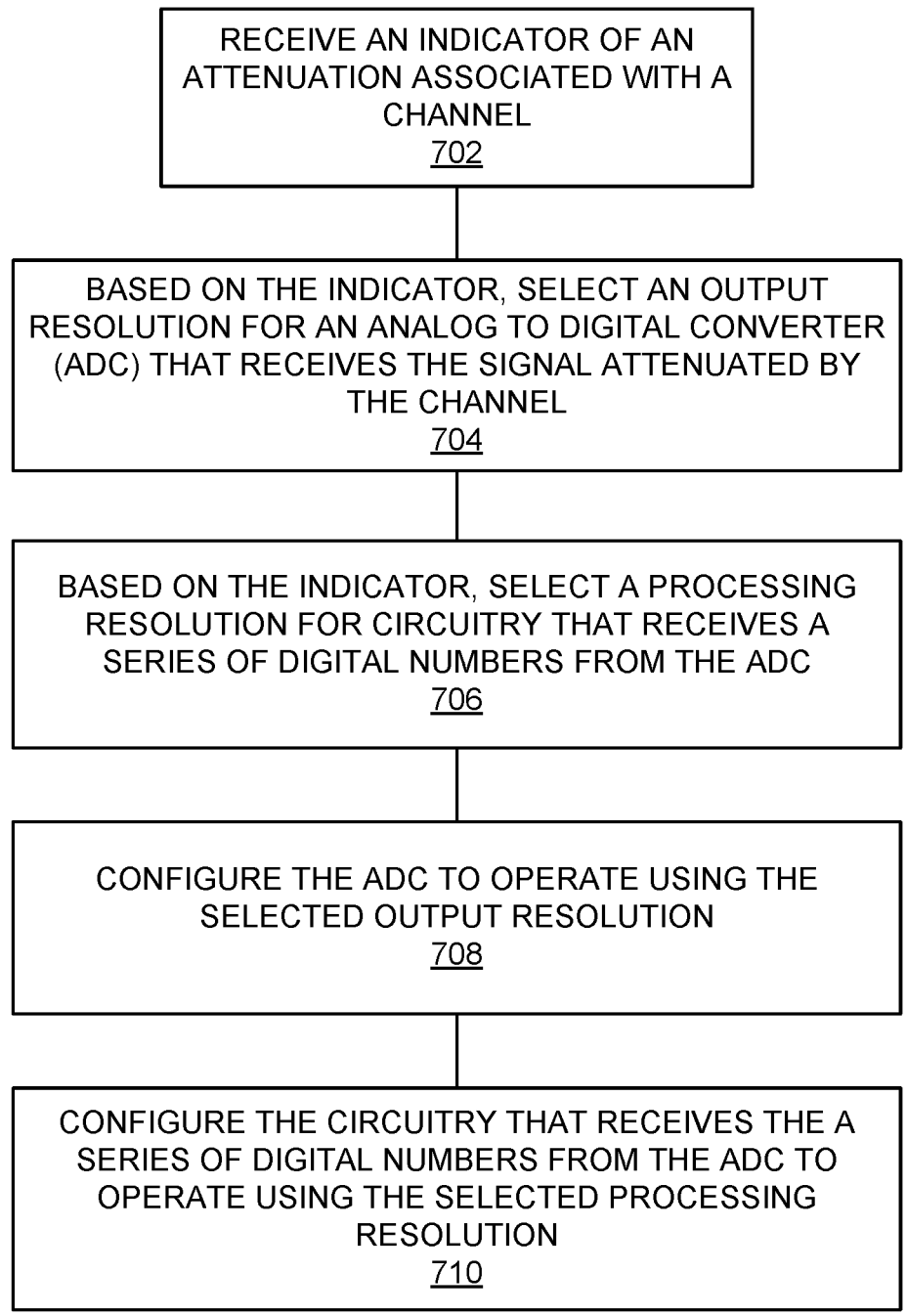
FIG. 7 is a flowchart illustrating variable resolution data reception.

FIG. 7 is a flowchart illustrating variable resolution data reception. The steps illustrated in FIG. 7 may be performed by one or more elements of system 100, system 200, and/or one or more of their components. An indicator of an attenuation associated with a channel is received (702). For example, resolution control 220 may receive an indicator associated with the attenuation or loss that occurs when a signal is sent via interconnect network channel 240.

Based on the indicator, an output resolution for an analog-to-digital converter that receives the signal attenuated by the channel is received (704). For example, resolution control 220 may select an output resolution for ADC 250 based on the received indicator, ATTEN. Based on the indicator, select a processing resolution for circuitry that receives a series of digital numbers from the analog-to-digital converter (706). For example, resolution control 220 may select a processing resolution for logic 230 based on the received indicator, ATTEN.

Figure 8:
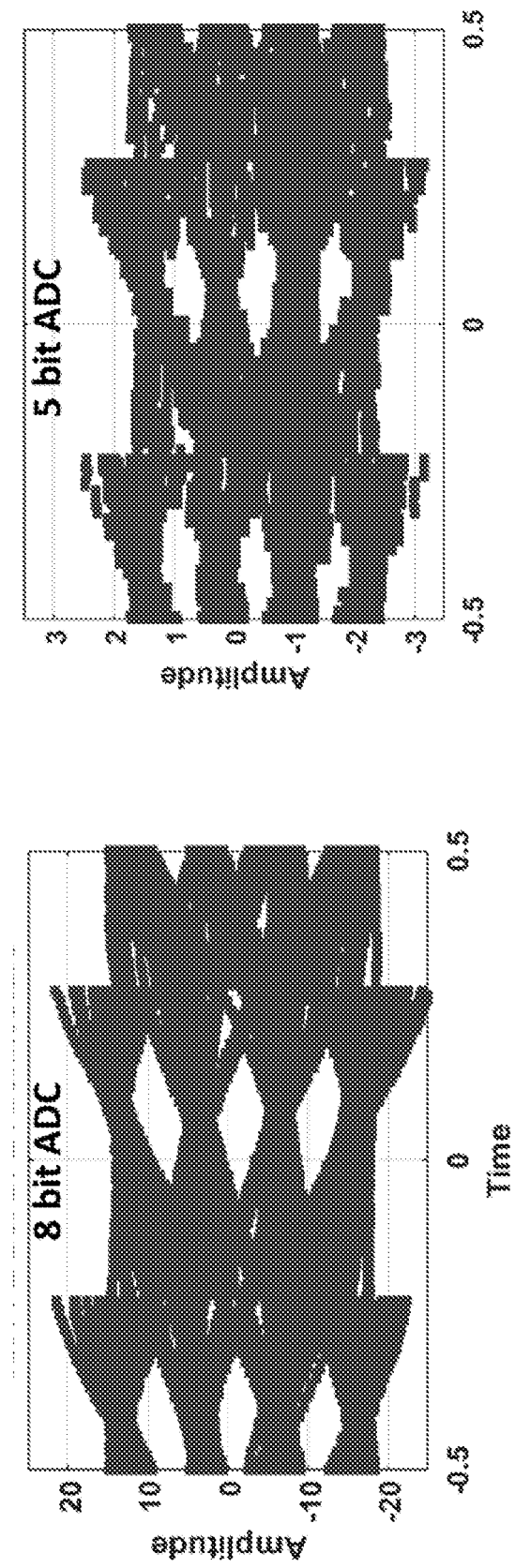
FIG. 8 is an illustration comparing eye diagrams having different sampling and processing resolutions.

The ADC is configured to operate using the selected output resolution (708). For example, resolution control 220 may configure ADC 250 to convert and output fewer bits than ADC 250's maximum output resolution. The circuitry that receives the series of digital numbers from the analog-to-digital converter is configured to operate using the selected processing resolution (710). For example, resolution control 220 may configure logic 230 to process fewer bits than ADC 250's maximum output resolution. Resolution control may configure logic 230 to process fewer bits by disabling, inactivating, or powering-down sub-blocks (e.g., sub-block 231) that are associated with bits that are not to be processed by logic 230. FIG. 8 is an illustration comparing eye diagrams having different sampling and processing resolutions.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
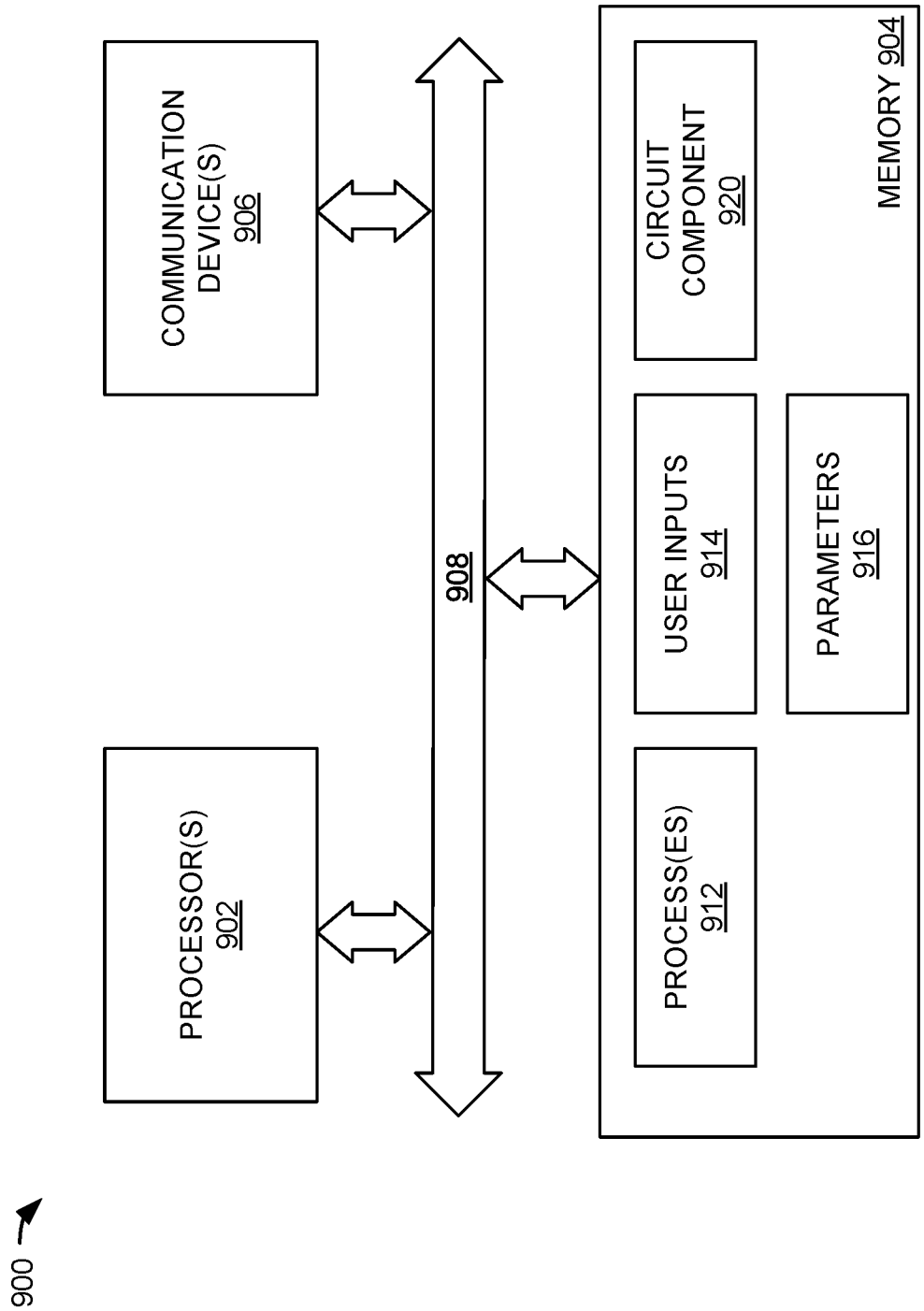
FIG. 9 is a block diagram of a processing system.

FIG. 9 is a block diagram illustrating one embodiment of a processing system 900 for including, processing, or generating, a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to process and/or generate circuit component 920 responsive to user inputs 914 and parameters 916. Processes 912 may be any suitable electronic design automation (EDA) tool or portion thereof used to design, simulate, analyze, and/or verify electronic circuitry and/or generate photomasks for electronic circuitry. Representation 920 includes data that describes all or portions of system 100, system 200, and their components, as shown in the Figures.

Representation 920 may include one or more of behavioral, register transfer, logic component, transistor, and layout geometry-level descriptions. Moreover, representation 920 may be stored on storage media or communicated by carrier waves.

Data formats in which representation 920 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 914 may comprise input parameters from a keyboard, mouse, voice recognition interface, microphone and speakers, graphical display, touch screen, or other type of user interface device. This user interface may be distributed among multiple interface devices. Parameters 916 may include specifications and/or characteristics that are input to help define representation 920. For example, parameters 916 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 904 includes any suitable type, number, and/or configuration of non-transitory computer-readable storage media that stores processes 912, user inputs 914, parameters 916, and circuit component 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit circuit component 920 to another system. Communications devices 906 may receive processes 912, user inputs 914, parameters 916, and/or circuit component 920 and cause processes 912, user inputs 914, parameters 916, and/or circuit component 920 to be stored in memory 904.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
    an interface to be coupled to receive a signal that is conveyed via a signal channel;
    an adjustable resolution analog-to-digital converter (ADC) to receive the signal via the interface;
    adjustable resolution feed-forward equalization circuitry that amplifies high frequency signal content and noise content to receive, from the ADC, a first digital number representing the signal and to produce a second digital number based at least in part on a digital finite impulse response filtering of a plurality of digital numbers previously received from the ADC; and, logic to select a first resolution of the ADC and a second resolution of the adjustable resolution feed-forward equalization circuitry.

2. The integrated circuit of claim 1, wherein the second resolution is based at least in part on a required feed-forward equalization gain.

3. The integrated circuit of claim 2, wherein the logic also selects a number of taps that are used to implement the digital finite impulse response filtering.

4. The integrated circuit of claim 1, wherein the logic selects the first resolution by adjusting a number of comparisons the ADC uses to convert the signal to a digital number.

5. The integrated circuit of claim 4, wherein the ADC corresponds to a flash type ADC.

6. The integrated circuit of claim 4, wherein the ADC corresponds to a successive approximation type ADC.

7. The integrated circuit of claim 6, wherein the logic selects the first resolution by controlling a number of successive approximation iterations the ADC uses to convert the signal to a digital number.

8. An integrated circuit to receive a signal, comprising:
an adjustable resolution analog-to-digital converter (ADC) to convert the signal from an analog parameter to a first variable resolution digital value;
adjustable resolution feed-forward equalization circuitry that amplifies high frequency signal content and noise content to receive the first variable resolution digital value and to produce a second variable resolution digital value based at least in part on a digital finite impulse response filtering of a time series comprised of a plurality of digital numbers previously received from the ADC; and,
logic to select a first number of valid bits in the first variable resolution digital value and to select a second number of valid bits in the second variable resolution digital value.

9. The integrated circuit of claim 8, wherein the second number of valid bits in the second variable resolution digital value is based at least in part on the first number of valid bits in the first variable resolution digital value.

10. The integrated circuit of claim 8, wherein portions of circuitry used to implement the digital finite impulse response filtering comprise FFE taps that are activated based at least in part on the first number of valid bits in the first variable resolution digital value.

11. The integrated circuit of claim 8, wherein portions of circuitry used to implement the digital finite impulse response filtering are activated based at least in part of the first number of valid bits in the first variable resolution digital value.

12. The integrated circuit of claim 8, wherein the first number of valid bits in the first variable resolution digital value is controlled by activating circuitry to be used by the adjustable resolution ADC.

13. The integrated circuit of claim 12 wherein the adjustable resolution ADC comprises a plurality of ADC converters that are selectively activated.

14. The integrated circuit of claim 8, wherein the first number of valid bits in the first variable resolution digital value is controlled by setting a number of successive approximation iterations performed by the adjustable resolution ADC.

15. A method, comprising:
selecting an output resolution for an analog-to-digital converter (ADC) that receives a signal; and,
selecting a processing resolution for adjustable resolution feed-forward equalization circuitry that amplifies high frequency signal content and noise content and that receives first variable resolution digital values from the ADC and produces second variable resolution digital values based at least in part on a digital finite impulse response filtering of a time series comprised of a plurality of digital numbers previously received from the ADC.

16. The method of claim 15, further comprising:
selecting, a number of taps used for the digital finite impulse response filtering of a series of digital numbers from the ADC.

17. The method of claim 15, wherein the processing resolution is based at least in part on a required feed-forward equalization gain.

18. The method of claim 15, wherein the output resolution for the ADC is controlled by adjusting a number of comparisons the ADC uses to convert the signal to a digital number.

19. The method of claim 18, wherein the ADC corresponds to a flash type ADC.

20. The method of claim 18, wherein the ADC corresponds to a successive approximation type ADC.

* * * * *